United States Patent
Lee et al.

(10) Patent No.: US 7,990,770 B2
(45) Date of Patent: Aug. 2, 2011

(54) METHOD OF PROGRAMMING NONVOLATILE MEMORY DEVICE

(75) Inventors: Hee Youl Lee, Gyeonggi-do (KR); Ki Seog Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 35 days.

(21) Appl. No.: 12/635,226

(22) Filed: Dec. 10, 2009

(65) Prior Publication Data

US 2010/0246268 A1    Sep. 30, 2010

(30) Foreign Application Priority Data

Mar. 24, 2009   (KR) .................. 10-2009-0024932

(51) Int. Cl.
*G11C 16/04* (2006.01)
(52) U.S. Cl. .......... 365/185.18; 365/185.11; 365/185.23
(58) Field of Classification Search ............. 365/185.11, 365/185.14, 185.18, 185.23, 189.09
See application file for complete search history.

(56) References Cited

U.S. PATENT DOCUMENTS

| | | | | |
|---|---|---|---|---|
| 7,151,702 B2 * | 12/2006 | Han et al. | ................. | 365/189.09 |
| 7,440,326 B2 * | 10/2008 | Ito | ............................ | 365/185.18 |
| 7,486,557 B2 * | 2/2009 | Kim et al. | ................. | 365/185.11 |
| 2008/0055995 A1 | 3/2008 | Ito | | |
| 2009/0273983 A1 * | 11/2009 | Lee et al. | ................. | 365/185.23 |

FOREIGN PATENT DOCUMENTS

KR   1020060115992   11/2006

OTHER PUBLICATIONS

Notice of Allowance issued from Korean Intellectual Property Office on Nov. 30, 2010.

* cited by examiner

*Primary Examiner* — Gene N Auduong
(74) *Attorney, Agent, or Firm* — IP & T Group LLP

(57) ABSTRACT

In a method of programming a nonvolatile memory device, when a program is performed, a program voltage is applied to a first word line selected for the program. A first pass voltage is applied to three second word lines neighboring the first word line toward a source select line. First and second voltages are applied to third and fourth word lines neighboring the first word line toward the source select line. A second pass voltage is applied to the remaining word lines other than the first to fourth word lines.

18 Claims, 6 Drawing Sheets

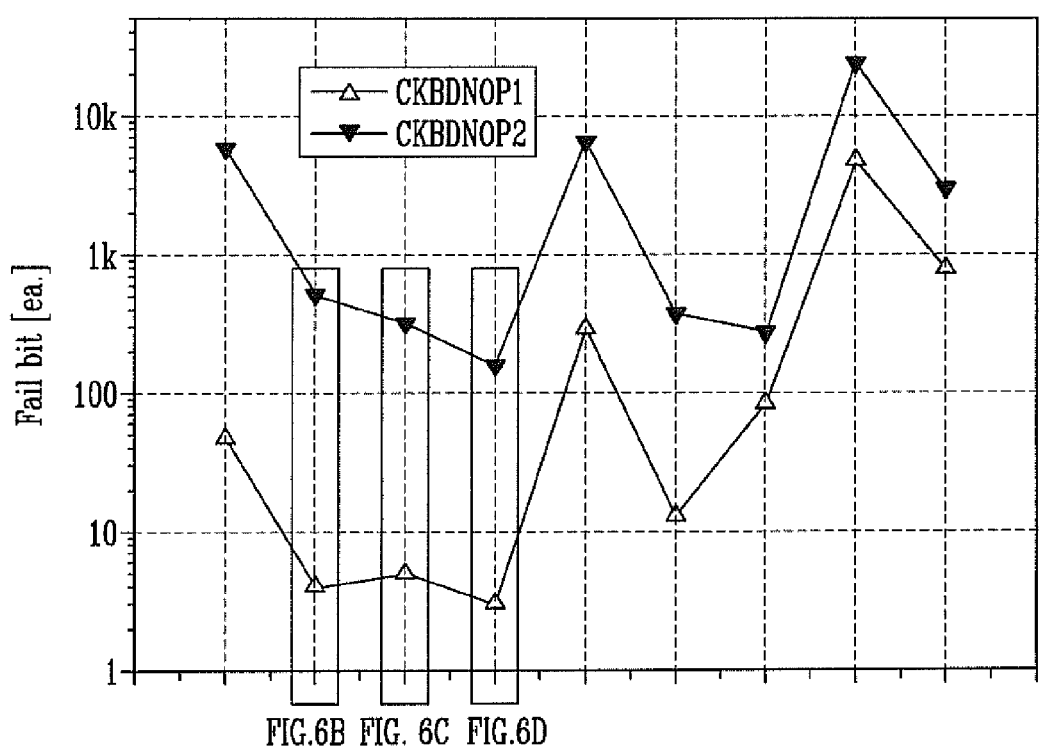

US 7,990,770 B2

METHOD OF PROGRAMMING NONVOLATILE MEMORY DEVICE

CROSS-REFERENCE TO RELATED APPLICATION

Priority to Korean patent application number 10-2009-0024932 filed on Mar. 24, 2009, the entire disclosure of which is incorporated by reference herein, is claimed.

BACKGROUND

An embodiment relates to a method of programming a nonvolatile memory device.

There is an increasing demand for semiconductor memory devices which can be electrically programmed and erased and can retain its data even without the supply of power. In order to develop high-capacity memory devices capable of storing large data, high integration technologies for memory cells are being developed. A nonvolatile memory device includes a memory cell array consisting of a plurality of strings. A single string includes a plurality of memory cells coupled in series.

The memory cell includes a gate in which a tunnel insulating layer, a floating gate, a dielectric layer, and a control gate are stacked over a semiconductor substrate and junction regions formed in the semiconductor substrate on both sides of the gate. During the program operation, hot electrons are injected into the floating gate. During the erase operation, electrons injected into the floating gate are discharged by F-N tunneling.

FIG. 1 is a sectional view showing the unit cell string of a nonvolatile memory device.

The unit cell string of the nonvolatile memory device includes memory cells respectively coupled to first to thirty-second word lines WL0 to WL31 between a drain select line DSL and a source select line SSL.

In the nonvolatile memory device comprising a number of the unit cell strings, when a program operation is performed, a program voltage (Vpgm) is applied to a selected word line, and a pass voltage (Vpass) is applied to the remaining word lines. Furthermore, a power supply voltage is supplied to the drain select line DSL, and 0 V is applied to the source select line SSL.

Accordingly, a transistor coupled to the drain select line DSL is turned on, and a transistor coupled to the source select line SSL is turned off. However, as voltage of a channel boosting area rises due to the occurrence of channel boosting, the transistor coupled to the drain select line DSL is also turned off.

FIG. 1 is a diagram showing voltages applied in the case where the thirtieth word line WL29 is selected for a program. A program voltage (Vpgm) is applied to the thirtieth word line WL29, and a pass voltage (Vpass) is applied to the remaining word lines.

The program voltage (Vpgm) is applied to not only the selected memory cell, but memory cells coupled to other cell strings arranged on the same word line. Consequently, unselected memory cells coupled to the same word line can be programmed. Such a phenomenon is called a program disturbance phenomenon.

To prevent the program disturbance phenomenon, a bit line to which the unselected memory cells are coupled is charged to a level (Vcc-Vth) (where Vcc is the power supply voltage and Vth is the threshold voltage of the drain select transistor) so that the channel voltage (Vch) of each cell string is boosted during the program operation, thereby preventing the unselected memory cells from being programmed.

In this case, if the channel boosting level is low, program disturbance resulting from F-N tunneling can be generated. If the channel boosting level is high, program disturbance resulting from injection of hot electrons can be generated. Accordingly, the pass voltage (Vpass) applied to the word lines may be controlled for adequate channel boosting.

Furthermore, channel boosting may be hindered by the threshold voltage levels of memory cells neighboring a selected memory cell. To solve this problem, an erase area self-boosting method may be used.

FIG. 2 is a sectional view of a cell string for illustrating the erase area self-boosting method. In FIG. 2, the cell string is coupled to an unselected bit line.

Referring to FIG. 2, in the erase area self-boosting method, a program voltage (Vpgm) is applied to a thirtieth word line WL29 selected for a program, 0 V is applied to a twenty-ninth word line WL28, and a pass voltage (Vpass) is applied to the remaining word lines. For example, a power supply voltage VCC is applied to the unselected bit line.

Furthermore, the power supply voltage is applied to a drain select line DSL, and 0 V is applied to a source select line SSL.

Accordingly, a transistor coupled to the drain select line DSL is turned on, and a transistor coupled to the source select line SSL is turned off. However, channel boosting is generated, and so the transistor coupled to the drain select line DSL is also turned off because of high channel boosting.

If word line voltages are applied as described above, high channel boosting is generated from the twenty-ninth word line WL28 toward the drain select line DSL, and so a transistor coupled to the twenty-ninth word line WL<28> is not programmed. Low channel boosting is generated from the source select line SSL to the twenty-ninth word line WL28.

The erase area self-boosting method is very efficient in the case where memory cells placed from a selected memory cell toward the drain select line are not programmed, but raises a concern in that the number of memory cells participating in boosting is limited in the case where there are programmed memory cells among memory cells and the programmed memory cells are placed from a selected memory cell toward the drain select line.

With the size of a nonvolatile memory device gradually decreasing, the length and width of the gate of a cell also decreases. Accordingly, if a small number of limited cells take part in channel boosting, the capacitance value of a channel becomes very small, which is not sufficient for reducing effects from the leakage current. Accordingly, a program is influenced here because a channel potential is reduced even by a low leakage current.

Furthermore, if the number of cells participating in boosting is reduced, an influence by a high program voltage is increased, resulting in a high boosting channel potential. Accordingly, the number of electrons generated by a gate induced drain leakage (GIDL) phenomenon is increased. Further, a disturbance fail can occur because of hot electrons generated by a strong electric field caused by a difference in the high potential.

BRIEF SUMMARY

An embodiment relates to a method of programming a nonvolatile memory device, which is capable of improving the characteristic of a cell by controlling the number of memory cells that are included in cell boosting of a program-inhibited cell string in a program operation.

A method of programming a nonvolatile memory device according to an embodiment comprises providing the nonvolatile memory device including memory blocks that each comprise a plurality of word lines between a drain select line and a source select line, enabling a selected memory block in response to a program command, applying a program voltage to a selected word line of the enabled memory block, applying a first pass voltage to a first group, which is at least three word lines adjacent to the selected word line toward the source select line, applying a first voltage to a first word line which is adjacent to the first group toward the source select line, applying a second voltage to a second word line which is adjacent toward the first word line to the source select line, and applying a second pass voltage to remaining word lines.

A voltage level of the program voltage is higher than the first pass voltage.

A voltage level of the first pass voltage is equal to or higher than the second pass voltage.

A voltage level of the second pass voltage is higher than the first voltage.

A voltage level of the first voltage is higher than the second voltage.

The first and second voltages include a buffer voltage and a cut-off voltage for isolating boosting channels of a program-inhibited cell string during the program.

A method of programming a nonvolatile memory device according to other embodiment comprises providing the nonvolatile memory device including memory blocks each comprising a plurality of word lines between a drain select line and a source select line, enabling a selected memory block in response to a program command, applying a program voltage to a selected word line of the enabled memory block, applying a first pass voltage to a first group, which is at least three word lines adjacent to the selected word line toward the source select line, and to a second group, which is at least one or more word line adjacent to the selected word line toward the drain select line, applying a first voltage to a first word line adjacent to the first group toward the source select line and to a second word line adjacent to the second group toward the drain select line, applying a second voltage to a third word line adjacent to the first word line toward the source select line and a fourth word line adjacent to the second word line toward the drain select line, and applying a second pass voltage to remaining word lines.

A voltage level of the program voltage is higher than the first pass voltage.

A voltage level of the first pass voltage is equal to or higher than the second pass voltage.

A voltage level of the second pass voltage is higher than the first voltage.

A voltage level of the first voltage is higher than the second voltage.

The first and second voltages include a buffer voltage and a cut-off voltage for isolating boosting channels of a program-inhibited cell string during the program.

A method of programming a nonvolatile memory device according to another embodiment comprises providing the nonvolatile memory device including memory blocks each comprising a plurality of word lines between a drain select line and a source select line, enabling a selected memory block in response to a program command, applying a program voltage to a first group, which is at least three word lines adjacent to the selected word line toward the source select line, and to a second group, which is at least one or more word line adjacent to the selected word line toward the drain select line, applying a first voltage to a first word line adjacent to the first group toward the source select line, applying a second voltage to a second word line adjacent to the first word line toward the source select line, and applying a second pass voltage to remaining word lines.

A voltage level of the program voltage is higher than the first pass voltage.

A voltage level of the first pass voltage is equal to or higher than the second pass voltage.

A voltage level of the second pass voltage is higher than the first voltage.

A voltage level of the first voltage is higher than the second voltage.

The first and second voltages include a buffer voltage and a cut-off voltage for isolating boosting channels of a program-inhibited cell string during the program.

BRIEF DESCRIPTION OF THE DRAWINGS

FIG. 7 is a diagram showing experimental results of FIGS. 6B to 6D.

DESCRIPTION OF EMBODIMENT

Hereinafter, an embodiment of the present disclosure will be described in detail with reference to the accompanying drawings. The drawings are provided to allow those having ordinary skill in the art to understand the scope of the embodiment of the disclosure.

In programming a nonvolatile memory device, in order to improve interference, a method of determining a program sequence is changed from an existing method of randomly determining the program sequence to a method of sequentially programming a $0^{th}$ word line WL0 to a thirty-first word line WL31. By changing the program sequence, the influence of an interference phenomenon may be reduced by limiting the number of peripheral cells influenced by a program operation to, for example, 5 after the program operation is performed on one memory cell.

Further, a re-program method is used, where, with the development of a multi-level cell capable of storing several pieces of bit information, several logical pages are allocated to one word line and the number of threshold voltage distributions formed by programmed memory cells is increased.

The re-program method is a method of performing, for example, a least significant bit (LSB) page program on a nonvolatile memory device including an MLC capable of storing 2-bit information and then performing a most significant bit (MSB) page program on the nonvolatile memory device.

In this method, however, the threshold voltages of cells can may be increased because the LSB page program for cells neighboring in the direction of the drain select line is completed before the MSB page program is performed.

Figure 1:
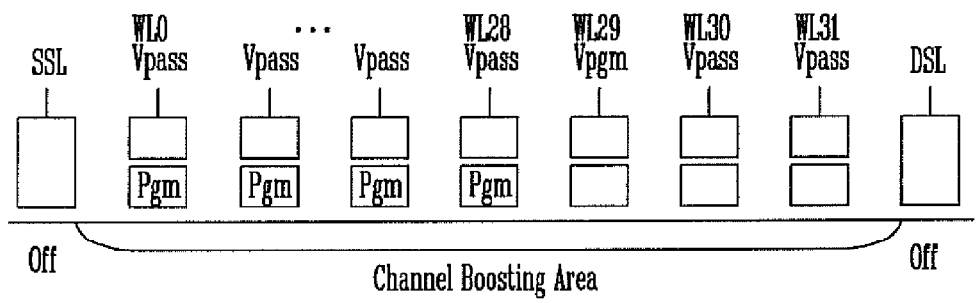
FIG. 1 is a sectional view showing the unit cell string of a nonvolatile memory device.
Figure 2:
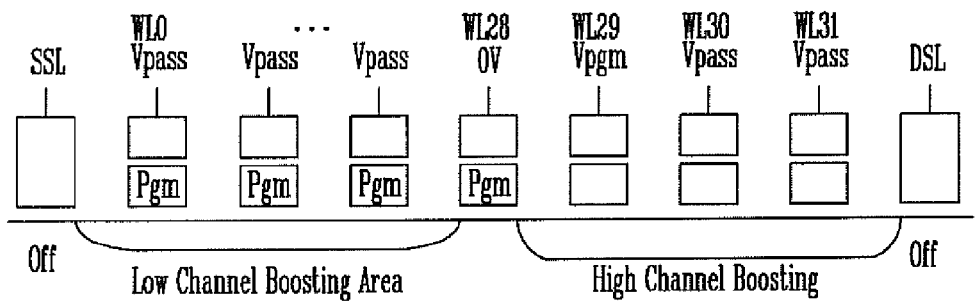
FIG. 2 is a sectional view of a cell string for illustrating an erase area self-boosting method.
Figure 3A:
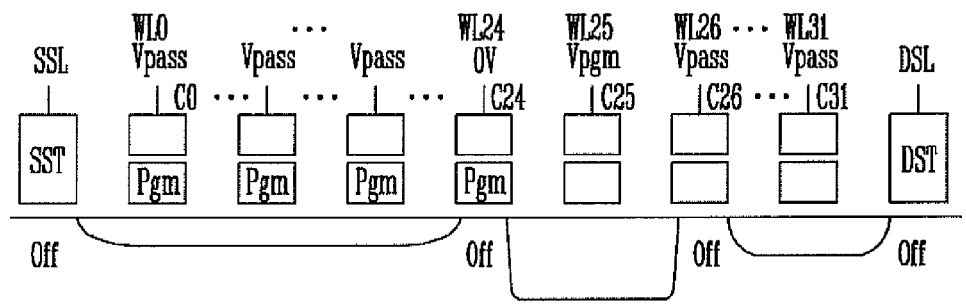
FIG. 3A is a diagram showing a state in which channel boosting has occurred according to application of voltages to a program-inhibited cell string in a program operation using a re-program method.

FIG. 3A is a diagram showing a state in which channel boosting has occurred according to an application of voltages to a program-inhibited cell string in a program operation using a re-program method.

Referring to FIG. 3A, the cell string includes a $0^{th}$ to thirty-first word lines WL0 to WL31 between a drain select line DSL and a source select line SSL.

A drain select transistor DST is coupled to the drain select line DSL, and a source select transistor SST is coupled to the source select line SSL.

$0^{th}$ to thirty-first memory cells C0 to C31 are respectively coupled to the $0^{th}$ to thirty-first word lines.

Furthermore, the twenty-fifth word line WL25 is selected for a program, and a program voltage (Vpgm) is applied to the twenty-fifth word line WL25. A power supply voltage is applied to the drain select line DSL, and 0 V is applied to the source select line SSL.

In this case, the transistor coupled to the drain select line DSL is turned on, and the transistor coupled to the source select line is turned off. However, when channel boosting is generated, the transistor coupled to the drain select line DSL is turned off because of high channel boosting.

Furthermore, 0 V is applied to the twenty-fourth word line WL24, and a pass voltage (Vpass) is applied to the remaining word lines. Here, the $0^{th}$ to twenty-fourth memory cells C0 to C24 have already been programmed, and the LSB page program has performed on the twenty-sixth memory cell C26. Accordingly, the twenty-sixth memory cell C26 is not sufficiently turned on by the pass voltage and is turned off by channel boosting.

Accordingly, as shown in FIG. 3A, three boosting channels are generated. That is, the first channel is generated from the source select transistor SST to the twenty-fourth memory cell C24, the second channel is generated from the twenty-fourth memory cell C24 to the twenty-sixth memory cell C26, and the third channel is generated from the twenty-sixth memory cell C26 to the drain select transistor DST.

Figure 3B:
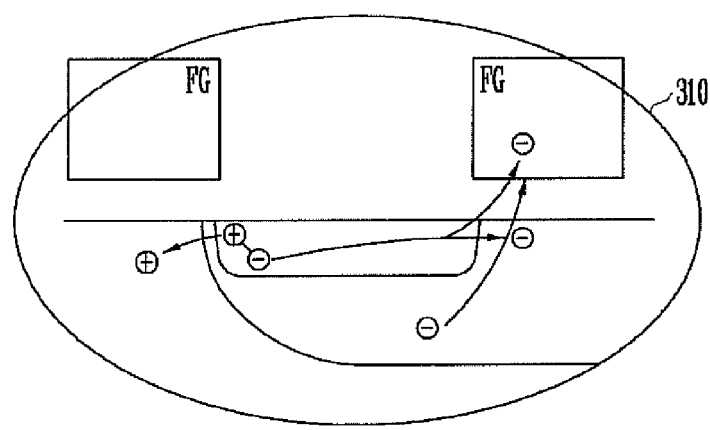
FIGS. 3B and 3C are enlarged diagrams showing a region between a selected memory cell and a channel in FIG. 3A.
Figure 3C:
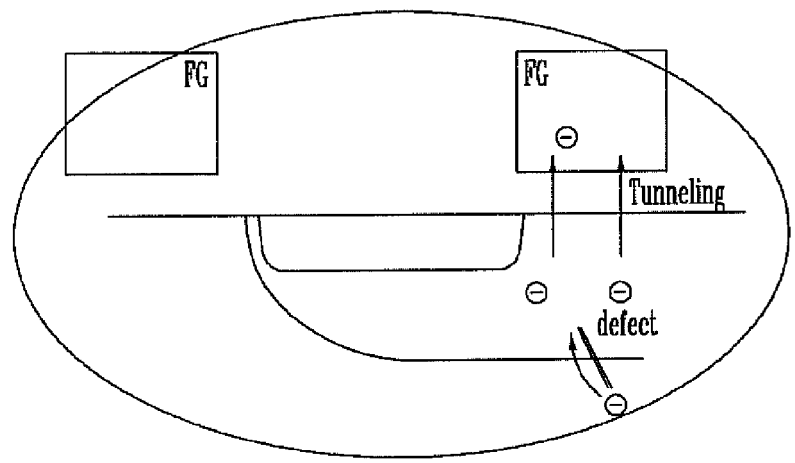

In this case, problems, such as those described below with reference to FIGS. 3B and 3C, are generated.

FIGS. 3B and 3C are enlarged diagrams showing a region between a selected memory cell and a channel in FIG. 3A.

FIGS. 3B and 3C show that, in the case where word line voltages are applied as shown in FIG. 3A, the number of electrons generated by the GIDL phenomenon caused by high channel boosting can be increased, and a disturbance fail can be generated by hot electrons generated by a strong electric field caused by a large potential difference.

Figure 4:
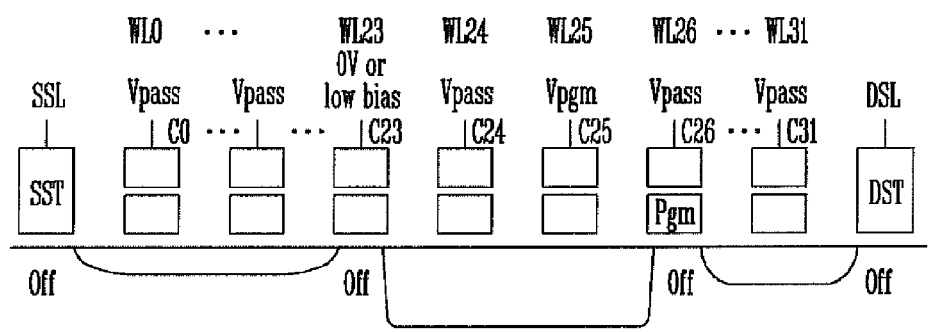
FIG. 4 is a diagram showing a state in which channel boosting has occurred according to application of voltages to a program-inhibited cell string in a program operation using another program method.

FIG. 4 is a diagram showing a state in which channel boosting has occurred according to application of voltages to a program-inhibited cell string in a program operation using another program method.

Referring to FIG. 4, a program voltage (Vpgm) is applied to a twenty-fifth word line WL25, a pass voltage (Vpass) is applied to a twenty-fourth word line WL24, and 0 V is applied to a twenty-third word line WL23.

Furthermore, a pass voltage (Vpass) is applied to the remaining word lines. Here, in the case where a twenty-sixth memory cell C26 is programmed, it is not turned on by the pass voltage (Vpass), but may be turned off.

Accordingly, a channel is formed as shown in FIG. 4. Since the number of memory cells is increased in the channel including a twenty-fifth memory cell C25 as compared with FIG. 3A, a problem that may occur because of excessive channel boosting can be reduced.

However, in the case where program inhibition is performed by applying the voltages to the word lines as in FIG. 4, it may still be insufficient to prevent excessive channel boosting.

Accordingly, program inhibition is performed by applying voltages to word lines as in the following embodiment.

Figure 5:
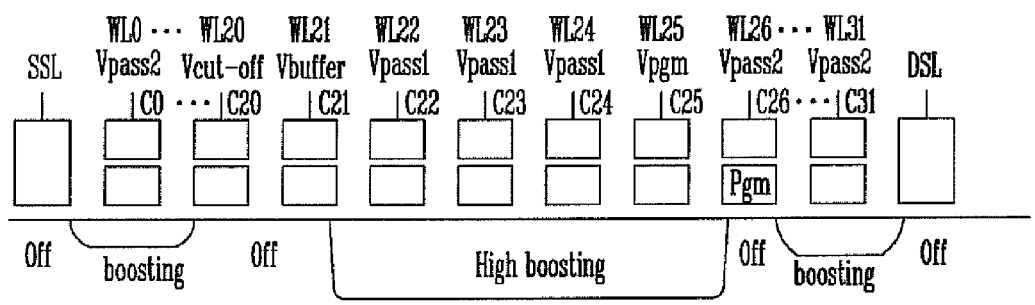
FIG. 5 is a diagram showing a state in which voltages are applied to the word lines of program-inhibited cells in a program method according to an embodiment.

FIG. 5 is a diagram showing a state in which voltages are applied to the word lines of program-inhibited cells in a program method according to an embodiment.

The nonvolatile memory device according to the present embodiment includes a number of memory blocks each including memory cells. The memory cells of the memory block are coupled together through $0^{th}$ to thirty-first word lines and bit lines. An operation of the nonvolatile memory device, such as a program, read, or erasure, is performed every memory block.

When a program command is inputted, one of the memory blocks is enabled according to address information inputted together with the program command, and a word line for a program is selected from the enabled memory block.

In a program method according to the embodiment, in the case where a program voltage (Vpgm) is applied to a selected twenty-fifth word line WL25, voltages are applied to word lines as shown in FIG. 5.

Furthermore, the $0^{th}$ to twenty-fourth word lines WL0 to WL24 neighboring from the twenty-fifth word line WL25 toward the source select line SSL are classified into a number of groups, and a first pass voltage Vpass1 is applied to the first group which is closest to the twenty-fifth word line WL25. Here, the first group includes at least three word lines.

In the embodiment of this disclosure, the twenty-second to twenty-fourth word lines WL22 to WL24 are included in the first group.

That is, the first pass voltage (Vpass1) is applied to the twenty-second to twenty-fourth word lines WL22 to WL24. Furthermore, a buffer voltage (Vbuffer) is applied to the twenty-first word line WL21, and a cut-off voltage (Vcut-off) is applied to the twentieth word line WL20. A second pass voltage (Vpass2) is applied to the remaining word lines. Here, the first and second pass voltages (Vpass1, Vpass2) may have the same voltage level or different voltage levels.

The buffer voltage (Vbuffer) and the cut-off voltage (Vcut-off) are voltages for isolation, and they function to isolate channels through the turn-off of memory cells according to on-going boosting.

The program voltage (Vpgm), the first and second pass voltages (Vpass1, Vpass2), the buffer voltage (Vbuffer), and the cut-off voltage (Vcut-off) may have the following relationship shown in Equation 1.

$$V\text{pgm} > V\text{pass1} \geq V\text{pass2} > V\text{buffer} > V\text{cut-off} \quad (1)$$

When the word line voltages are applied as in FIG. 5, memory cells C22 and C23, and the twenty-fifth memory cell C25, to which the program voltage is applied take part in channel boosting. Accordingly, the potential of the word lines participating in the boosting is expressed by Equation 2.

$$\frac{(Vpgm + 3Vpass1)}{4} \quad (2)$$

$$\frac{(Vpgm + Vpass1)}{2}, \frac{(Vpgm + 2Vpass2)}{3} \quad (3)$$

It can be seen that Equation 2 has a smaller potential than that of a case where only the twenty-fifth memory cell C25 participates in boosting or Equation 3 showing a potential when the number of memory cells participating in boosting is 1 or 2.

Accordingly, excessive channel boosting is prevented, and so formation of hot electrons can be prevented.

Furthermore, in the case where the leakage current is generated, the twenty-second to twenty-fifth memory cells C22 to C25 take part in channel boosting. Accordingly, an F-N tunneling-caused program disturbance phenomenon can be reduced because a drop in the channel boosting level can be prevented.

One of factors to effectively reduce disturbance through the method of applying a pass voltage to three word lines from a word line selected for a program toward the source select line and performing cut-off, as in the above embodiment, is described below in more detail.

FIGS. 6A to 6E are diagrams showing various examples in which voltages are applied to word lines when a program is performed.

Figure 6A:
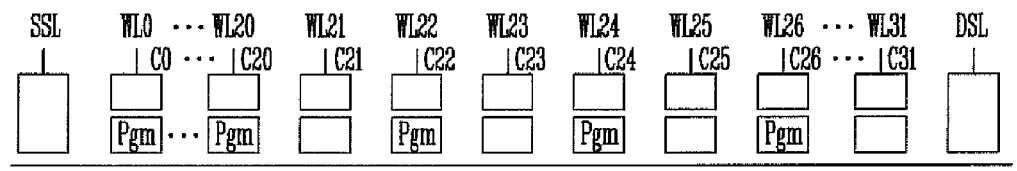
FIGS. 6A to 6E are diagrams showing various examples in which voltages are applied to word lines when a program is performed.

FIG. 6A shows a cell string to which a program pattern that can be most influenced by disturbance when the disturbance is generated by a boosting channel voltage is applied. FIGS. 6B to 6E show examples in which word line voltages are applied to a cell string programmed as in FIG. 6A.

Referring to FIG. 6A, a program pattern in which disturbance is generated to the extreme, from among program patterns in which a self-boosting level generates disturbance by the re-program method corresponds to a case where memory cells are alternately in program and erase states.

That is, FIG. 6A shows the above case in which program patterns are formed in such a manner that even-numbered memory cells, including a $0^{th}$ memory cell C0 of a program state and a first memory cell C1 of an erase state, become a program state, and odd-numbered memory cells become an erase state.

In the case where, as shown in FIG. 6A, in the state in which program patterns are formed from $0^{th}$ to twenty-fourth memory cells C0 to C24, a twenty-fifth word line WL25 is selected and programmed, a boosting level is varied according to voltage applied to the word lines.

Figure 6B:
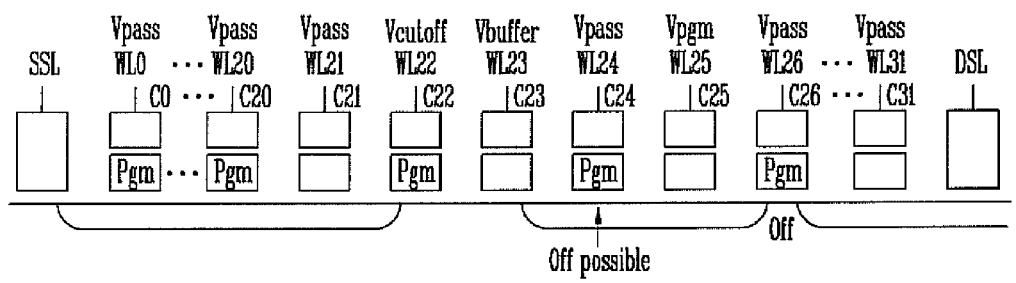

In FIG. 6B, a program voltage (Vpgm) is applied to the twenty-fifth word line WL25, and a pass voltage (Vpass) is applied to the twenty-fourth word line WL24.

Furthermore, a buffer voltage (Vbuffer) is applied to the twenty-third word line WL23, a cut-off voltage (Vcut-off) is applied to the twenty-second word line WL22, and a pass voltage (Vpass) is applied to the remaining word lines. The pass voltage (Vpass) applied to the twenty-fourth word line WL24 can be equal to or slightly lower than the pass voltage (Vpass) applied to the remaining word lines.

If the voltages are applied to the word lines as in FIG. 6B, during a program operation, a twenty-sixth memory cell C26 coupled to the twenty-sixth word line WL26 is turned off in a boosting process. The reason why the twenty-sixth memory cell C26 is turned off is that a boosting voltage level rises because memory cells respectively coupled to twenty-seventh to thirty-first word lines WL27 to WL31 are in an erase state.

Furthermore, twenty-fourth memory cell C24 can be turned off because of the above-discussed reason. When the twenty-fourth memory cell C24 is turned off, voltage of the boosting channel including the twenty-fifth memory cell C25 is excessively increased, leading to the occurrence of disturbance.

Accordingly, word line voltages are applied such that a single memory cell C25 is included in the boosting channel, including the twenty-fifth memory cell C25, on the part of the source select line SSL. That is, as shown in FIG. 6C, a pass voltage is applied to the twenty-third and twenty-fourth word lines WL23 and WL24.

Figure 6C:
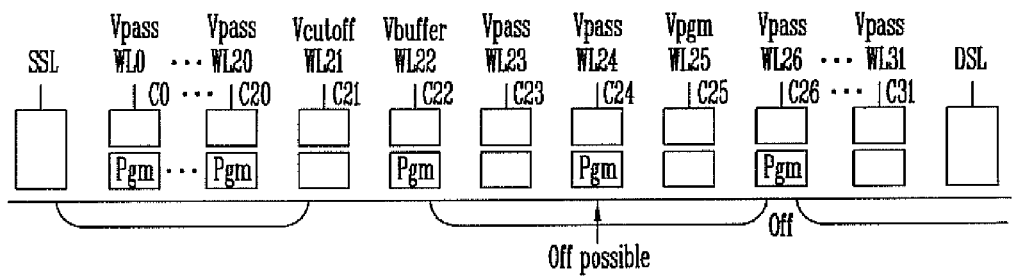

However, even in the case where the pass voltages are applied to the word lines as in FIG. 6C, the boosting voltage of a channel including the twenty-fifth memory cell C25 becomes too much high because the twenty-third memory cell C23 is in an erase state. Consequently, the twenty-fourth memory cell C24 can be turned off.

Figure 6D:
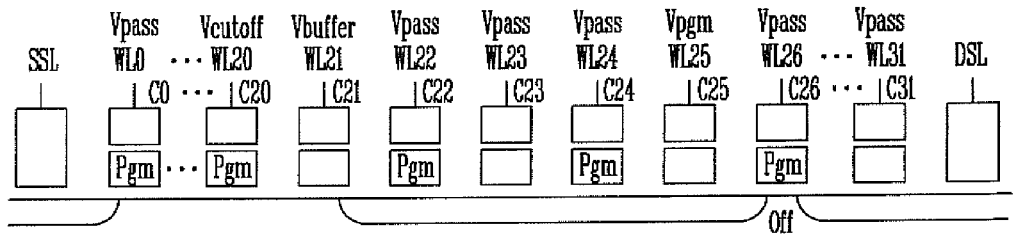

Accordingly, in an embodiment, as shown in FIG. 6D, a pass voltage (Vpass) is applied to the twenty-second to twenty-fourth word lines WL22 to WL24.

If the pass voltage is applied to the word lines as in FIG. 6D, a boosting voltage does not excessively rise because at least two program cells are included in a boosting channel including a twenty-fifth memory cell C25. Accordingly, when compared with the case where the voltages are applied as in FIG. 6B or 6C, less disturbance is generated.

Figure 6E:
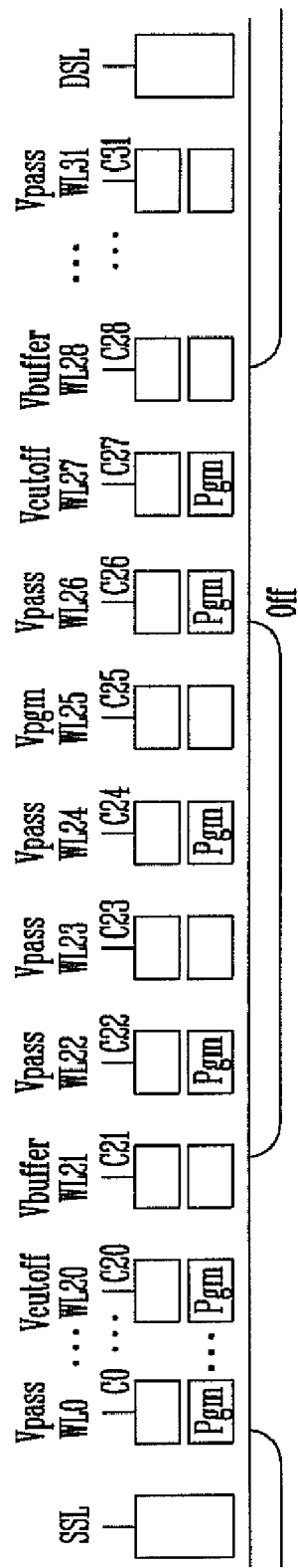

FIG. 6E shows a state in which the buffer voltage Vbuffer and the cut-off voltage Vcutoff are applied to both the source select line SSL and the drain select line DSL. The buffer voltage Vbuffer is applied to the twenty-seventh word line WL27, and the cut-off voltage Vcutoff is applied to the twenty-eighth word line WL28.

FIG. 7 shows experimental results of the arrangements in FIGS. 6B to 6D.

FIG. 7 shows the number of fail bits occurring when a program is performed by applying the word line voltages as in FIGS. 6B to 6D. From FIG. 7, it can be seen that the number of fail bits occurring when a pass voltage is applied to three word lines as in the embodiment of this disclosure and when channels are then isolated from each other is small. Graphs of FIG. 7 show experimental results which were performed in the case where the program state of a test board was different. From the drawing, it can be seen that, in two cases, the case of FIG. 6D according to the embodiment has the least number of fail bits.

According to this disclosure, optimal boosting is generated according to conditions by controlling the number of memory cells that participate in boosting in a program-inhibited cell string. Accordingly, disturbance can be reduced, and the characteristic of a program cell can be improved.

What is claimed is:

1. A method of programming a nonvolatile memory device, comprising:
   providing the nonvolatile memory device including memory blocks that each comprise a plurality of word lines between a drain select line and a source select line;
   enabling a selected memory block in response to a program command;
   applying a program voltage to a selected word line of the enabled memory block;
   applying a first pass voltage to a first group, which is at least three word lines adjacent to the selected word line toward the source select line;
   applying a first voltage to a first word line which is adjacent to the first group toward the source select line;
   applying a second voltage to a second word line which is adjacent toward the first word line to the source select line; and
   applying a second pass voltage to remaining word lines.

2. The method of claim 1, wherein a voltage level of the program voltage is higher than the first pass voltage.

3. The method of claim 1, wherein a voltage level of the first pass voltage is equal to or higher than the second pass voltage.

4. The method of claim 1, wherein a voltage level of the second pass voltage is higher than the first voltage.

5. The method of claim 1, wherein a voltage level of the first voltage is higher than the second voltage.

6. The method of claim 1, wherein the first and second voltages include a buffer voltage and a cut-off voltage for isolating boosting channels of a program-inhibited cell string during the program.

7. A method of programming a nonvolatile memory device, comprising:
   providing the nonvolatile memory device including memory blocks each comprising a plurality of word lines between a drain select line and a source select line;
   enabling a selected memory block in response to a program command;
   applying a program voltage to a selected word line of the enabled memory block;
   applying a first pass voltage to a first group, which is at least three word lines adjacent to the selected word line toward the source select line, and to a second group, which is at least one or more word line adjacent to the selected word line toward the drain select line;
   applying a first voltage to a first word line adjacent to the first group toward the source select line and to a second word line adjacent to the second group toward the drain select line;
   applying a second voltage to a third word line adjacent to the first word line toward the source select line and a fourth word line adjacent to the second word line toward the drain select line; and
   applying a second pass voltage to remaining word lines.

8. The method of claim 7, wherein a voltage level of the program voltage is higher than the first pass voltage.

9. The method of claim 7, wherein a voltage level of the first pass voltage is equal to or higher than the second pass voltage.

10. The method of claim 7, wherein a voltage level of the second pass voltage is higher than the first voltage.

11. The method of claim 7, wherein a voltage level of the first voltage is higher than the second voltage.

12. The method of claim 7, wherein the first and second voltages include a buffer voltage and a cut-off voltage for isolating boosting channels of a program-inhibited cell string during the program.

13. A method of programming a nonvolatile memory device, comprising:
   providing the nonvolatile memory device including memory blocks each comprising a plurality of word lines between a drain select line and a source select line;
   enabling a selected memory block in response to a program command;
   applying a program voltage to a first group, which is at least three word lines adjacent to the selected word line toward the source select line, and to a second group, which is at least one or more word line adjacent to the selected word line toward the drain select line;
   applying a first voltage to a first word line adjacent to the first group toward the source select line;
   applying a second voltage to a second word line adjacent to the first word line toward the source select line; and
   applying a second pass voltage to remaining word lines.

14. The method of claim 13, wherein a voltage level of the program voltage is higher than the first pass voltage.

15. The method of claim 13, wherein a voltage level of the first pass voltage is equal to or higher than the second pass voltage.

16. The method of claim 13, wherein a voltage level of the second pass voltage is higher than the first voltage.

17. The method of claim 13, wherein a voltage level of the first voltage is higher than the second voltage.

18. The method of claim 13, wherein the first and second voltages include a buffer voltage and a cut-off voltage for isolating boosting channels of a program-inhibited cell string during the program.

* * * * *